US012785374B2

(12) United States Patent
Rutgers

(10) Patent No.: US 12,785,374 B2
(45) Date of Patent: Nov. 3, 2026

(54) SEALING ELEMENT FOR SEALING A PASSAGE FOR A CABLE ASSEMBLY THROUGH A WALL, AND ITS USE IN HOUSING FOR ACCOMMODATING DEVICES SUCH AS ELECTRICAL, ELECTRONIC AND OPTICAL DEVICES

(71) Applicants: MINKELS B.V., AC Veghel (NL); LEGRAND SNC, Limoges (FR); LEGRAND FRANCE, Limoges (FR)

(72) Inventor: Bastiaan Rutgers, AA Veghel (NL)

(73) Assignees: MINKELS B.V., AC Veghel (NL); LEGRAND SNC, Limoges (FR); LEGRAND FRANCE, Limoges (FR)

( * ) Notice: Subject to any disclaimer, the term of this patent is extended or adjusted under 35 U.S.C. 154(b) by 247 days.

(21) Appl. No.: 18/838,495

(22) PCT Filed: Dec. 29, 2022

(86) PCT No.: PCT/NL2022/050767
§ 371 (c)(1),
(2) Date: Aug. 14, 2024

(87) PCT Pub. No.: WO2023/163584
PCT Pub. Date: Aug. 31, 2023

(65) Prior Publication Data

US 2025/0158378 A1 May 15, 2025

(30) Foreign Application Priority Data

Feb. 24, 2022 (NL) ...................................... 2031059

(51) Int. Cl.
*H02G 15/013* (2006.01)
*H02G 3/22* (2006.01)
(Continued)

(52) U.S. Cl.
CPC ............. *H02G 15/013* (2013.01); *H02G 3/22* (2013.01); *H05K 5/069* (2013.01); *H05K 7/1491* (2013.01)

(58) Field of Classification Search
CPC ........ H02G 15/013; H02G 3/22; H02G 15/00; H02G 15/007; H02G 15/04; H05K 5/069;
(Continued)

(56) References Cited

U.S. PATENT DOCUMENTS 4,702,444 A * 10/1987 Beele ........................ F16L 5/14 174/151
6,632,999 B2 * 10/2003 Sempliner ................. F16L 5/00 174/153 G
(Continued)

FOREIGN PATENT DOCUMENTS

DE 3440512 A1 4/1986
EP 0940615 A1 9/1999

OTHER PUBLICATIONS

Applicant: Minkels B.v., Legrand SNC, Legrand France; "Sealing Element for Sealing a Passage for a Cable Assembly through a Wall, and its use in Housing for Accommodating Devices such as Electrical, Electronic and Optical Devices"; International Application No. PCT/NL2022/050767; International Search Report Mailed Apr. 3, 2023; 2 pgs.

(Continued)

*Primary Examiner* — Angel R Estrada
(74) *Attorney, Agent, or Firm* — Renner, Otto, Boisselle & Sklar, LLP; Christopher P. Harris

(57) ABSTRACT

A sealing element 2 for sealing a passage for a cable assembly 3 through a wall 11*c* is described. The sealing element 2 has a first member 21 and a second member 22 mutually coupled by a sleeve 24 made of flexible material. The first and the second member, as well as the sleeve, are
(Continued)

dividable to accept a longitudinal part of the cable assembly inside the periphery of the first and the second member, as well as the sleeve, and re-unitable to enclose said longitudinal part. The peripheral walls of the first and the second member are adapted to be engaged with each other in a sealed state, and the element may be switched between an open state, wherein the first member and the second member are disengaged and held at an axial distance from each other in an axial direction; and the sealed state which may be provided by twisting the first and/or second member in the open state relative to each other around the axial direction causing the first and the second member to move towards each other and the sleeve to also twist and seal against the cable assembly provided through the passage, and by engaging the first and the second member with each other. A method for sealing a passage for a cable assembly thorough a wall is also described. The sealing element may advantageously be used in housing for accommodating devices such as electrical, electronic and optical devices.

26 Claims, 12 Drawing Sheets

(51) Int. Cl.
*H05K 5/06* (2006.01)
*H05K 7/14* (2006.01)

(58) Field of Classification Search
CPC .. H05K 7/1491; F16L 5/02; F16L 5/10; F16L 5/00; H01R 13/5205; H01R 13/5216; H01R 43/005; H01R 13/5213; H01R 13/5202; H01R 13/52
USPC ...... 174/77 R, 650, 656, 137 R, 138 R, 142, 174/152 R, 151, 153 G, 152 G, 155, 156; 248/68.1, 49; 16/2.1, 2.2
See application file for complete search history.

(56) References Cited

U.S. PATENT DOCUMENTS

| | | | | |
|---|---|---|---|---|
| 7,442,884 | B2 * | 10/2008 | Ball | H02G 15/113 16/2.2 |
| 7,723,622 | B2 * | 5/2010 | Dukes | H02G 3/22 16/2.2 |
| 9,496,692 | B2 * | 11/2016 | Sprenger | H02G 3/08 |
| 10,298,001 | B2 * | 5/2019 | Nowastowski-Stock | H02G 1/06 |
| 11,237,026 | B2 * | 2/2022 | Bohlin | G06K 17/0022 |
| 11,818,862 | B1 * | 11/2023 | Krietzman | H05K 7/18 |
| 11,988,878 | B2 * | 5/2024 | Strang | G02B 6/3835 |
| 12,098,795 | B2 * | 9/2024 | Persson | H02G 3/22 |
| 12,362,548 | B2 * | 7/2025 | Grudd | H02G 3/22 |

OTHER PUBLICATIONS

Applicant: Minkels B.V.; International Application No. PCT/NL2022/050767; PCT Written Opinion of the International Searching Authority, 5 pgs.

* cited by examiner

SEALING ELEMENT FOR SEALING A PASSAGE FOR A CABLE ASSEMBLY THROUGH A WALL, AND ITS USE IN HOUSING FOR ACCOMMODATING DEVICES SUCH AS ELECTRICAL, ELECTRONIC AND OPTICAL DEVICES

CROSS-REFERENCE TO RELATED APPLICATION

This patent application is a U.S. National Stage Application filed under 35 U.S.C. § 371 of PCT/NL2022/050767, filed Dec. 29, 2022, and entitled SEALING ELEMENT FOR SEALING A PASSAGE FOR A CABLE ASSEMBLY THROUGH A WALL, AND ITS USE IN HOUSING FOR ACCOMMODATING DEVICES SUCH AS ELECTRICAL, ELECTRONIC AND OPTICAL DEVICES, which International Applications claims the benefit and priority of Netherlands Patent Application No. 2031059, filed on Feb. 24, 2022, the disclosure of which is incorporated by reference herein in its entirety as part of the present application.

TECHNICAL FIELD OF THE INVENTION

The invention relates to a sealing element for sealing a passage, in particular a passage for a cable assembly through a wall dividing two separate spaces. The sealing is preferably substantially airtight such that in a closed state of the sealing element, a minor amount or substantially no air may be transmitted from one space to the other of the two separate spaces through the sealing element. The sealing element thus allows passing a cable assembly from one space to the other space of the two separate spaces in an airtight manner through a passage in the wall.

A cable assembly is meant to comprise a single cable, a group of cables, or a bundle of cables, either twisted or untwisted. The cables may be of any type, such as electrical (copper) cables, fiber optical cables, power cables, and the like.

The invention also relates to a wall comprising a passage for a cable assembly, which passage comprises the sealing element as claimed.

The invention further relates to housing for accommodating devices such as electrical, electronic, and optical devices, comprising the sealing element as claimed.

The invention finally relates to a method for at least partly sealing a passage for a cable assembly through a wall.

BACKGROUND OF THE INVENTION

Housings for accommodating devices such as electrical, electronic and optical equipment, in particular computer equipment, have been known for some time. Non-limiting examples of applicable electronic equipment comprise servers, network hardware and sound technology equipment. Housings that may be used in business applications for instance, may comprise racks that are typically open walled, apart from a roof, and cabinets that typically comprise side walls as well. Such housings comprise a load bearing frame of interconnected frame members, which include floor frame members, vertically oriented side frame members, and roof frame members. Vertically oriented mounting rails for suspending equipment may be provided against and/or in between side frame members. Each mounting rail may be connected to a floor and a roof frame member. One example of such housing is a so-called 19-inch housing, which comprises a number of vertically oriented mounting rails that extend parallel to each other at a mutual standardized distance. Each mounting rail may be provided with a plurality of openings or other receivers, extending along a longitudinal direction of each mounting rail and provided at equal height between mounting rails. Standardized, optionally modular, equipment may be provided with fixation lips for connection to the openings or receivers, for instance by screws. In this way, multiple units of equipment may be suspended on top of each other in the same housing.

It is an important feature of housings or server cabinets to maintain conditioned (preferably cooled) air in the inside. In this way a greatest amount of conditioned air can reach the IT-equipment or other electrical, electronic, and optical devices. Such a solution provides an ecological and economical benefit to users of the housings or server cabinets. It would be desirable, to maintain conditioned air within the housing or cabinet, and thereto creating an airtight transit or passage through which a variable amount of cabling can go whilst keeping a substantial degree of airtightness. It would also be desirable to provide a sealing element that is able to keep conditioned air unaffected by otherwise conditioned or unconditioned air.

A known solution uses two sheet metal brackets with foam parts. The brackets are screwed together around the cables to create a seal, wherein cables are pressed in between the foam parts. The known solution is unsuitable for manufacturing in large amounts because it is too labour-intensive. Another downside is the requirement of a tool (for instance a screwdriver) to add or remove cables by temporarily removing half of the product. Mistakes can easily be made by unscrewing wrong components or using wrong screw settings whilst reassembling. Using a brush is sometimes requested but for aesthetic reasons, or for protection against dust and similar influences. A brush does not provide airtightness to the desired degree.

EP 0940615A1 discloses a device for sealing a passage for pipes and the like through a wall. The device comprises a first and a second part connected therewith via a sleeve-shaped body. The passage is reducible by rotation of the first part relative to the second part. The first and second parts are provided on opposite sides of the wall and cannot be engaged to each other. DE 3440512A1 discloses a similar device.

It is an object of the invention to provide a sealing element for sealing a passage for a cable assembly through a wall, that prevents or at least partially obviates the drawbacks of the prior art.

SUMMARY OF THE INVENTION

The invention thereto provides a sealing element in accordance with claim 1. The sealing element is adapted for sealing a passage for a cable assembly through a wall, and thereto comprises a first member and a second member mutually coupled by a sleeve made of flexible material, wherein:

- the first and the second member, as well as the sleeve, each have a peripheral wall that is
  - dividable to accept a longitudinal part of the cable assembly inside the periphery of the first and the second member, as well as the sleeve, and
  - re-unitable to enclose said longitudinal part;
- the peripheral walls of the first and the second member are adapted to be engaged with each other in a sealed state; and the element may be switched between

- an open state, wherein the first member and the second member are disengaged and held at an axial distance from each other in an axial direction; and
- the sealed state which may be provided by twisting the first and/or second member in the open state relative to each other around the axial direction causing the first and the second member to move towards each other and the sleeve to also twist and seal against the cable assembly provided through the passage, and by engaging the first and the second member with each other.

The invented sealing element provides a seal to transit cables from one space to another, where different climatic and/or atmospheric conditions apply. The seal provided by the invented sealing element can adapt to different types of cabling, for instance its diameter. It can further adapt to different amounts of cabling in the cable assembly and can organize the cables into a bundle or assembly. Varying connectors can be fitted in the sealing element during installation (for instance up to 90 mm in diameter).

A sealing element according to the invention does not have sharp edges on which the cables could get damaged and does not compromise the bend radius of cables. It can further be undone to add more cables, then redone by the end user. The sealing element may maintain its functionality over a period of at least 20 years, and fits in cut-outs in different types of walls, such as in the sheet metal plates, used in housing for accommodating devices such as electrical, electronic and optical devices.

It has further been shown that the sealing element and its attachment to the wall are strong enough to withstand forces which come from the weight of the cables, which may be substantial, and from within the application itself.

It should be noted that the invention is equally applicable to other housings, preferably with standardized dimensions, such as 23 inch or metric housings, that are for instance used in telecommunication. The invention also applies to other sheet metal parts outside such housings, for instance as used in corridors between such housings. Other applications in which the sealing element may be used advantageously are waterproof products, such as category IP55 or IP65 (for instance plexo box, power cabinets, . . . ), to replace the known cable glands, and electrical back boxes cable entry points.

One of the advantages of the invented sealing element is that it can readily be installed in a wall from one side of the wall, such as the outside of the side wall, a ceiling or floor panel of a housing or cabinet for accommodating devices such as electrical, electronic and optical devices. Indeed, the first member of the sealing element may be installed inside the passage of the wall from one side, and the second member may then be engaged with the first member from the same side of the wall as the one side. There is no need therefore to install any member of the sealing element from a side opposite to the one side, such as an interior side of a housing or cabinet for accommodating devices such as electrical, electronic and optical devices. The second member is directly engaged with the first member.

According to the invention, the first and the second member, as well as the sleeve, each have a peripheral wall that is dividable to accept a longitudinal part of the cable assembly inside the periphery of the first and the second member, as well as the sleeve. The divided state is used only to be able to accommodate the cable assembly inside the sealing element but cannot be used for sealing. To produce the sealing function of the sealing element, the sealing element and in particular the peripheral walls of the first and the second member, as well as of the sleeve, need to be re-united to enclose the longitudinal part of the cable assembly. Addressing the sealing function of the sealing element therefore implies that the sealing element is in the re-united state, i.e. a state in which the peripheral walls of the first and the second member, as well as of the sleeve, are closed and surround the enclosed cable assembly part.

The first and second member of the sealing element may have the shape of an electrical connector, and each may be circular, square or rectangular in a plane of the engaged first and second member in the re-united state. Square or rectangular in shape means that sides and corners may be distinguished, including sides that may not be straight, but slightly curved, and corners that may not necessarily be very sharp, but rounded. The first member may be provided in the passage of the wall by any means known in the art, such as by a frictional fitting. An outer periphery of the first member is than shaped such that it tightly fits into an inner periphery of the passage made in the wall.

A preferred embodiment provides a sealing element wherein the peripheral wall of the first and/or the second member is adapted to be accommodated in the passage of the wall, optionally by clamping, or provided against the wall and fastened thereto. Again, this requires the sealing element to be provided in its re-united state.

The first and the second member have a peripheral wall adapted to be engaged with each other in a sealed state. The engagement may for instance be embodied by providing the first and/or second member with elastic lips that may be clicked or otherwise provided in apertures of the second and/or first member. Other engaging arrangements are also possible. The engagement effectively locks the sealing element in the sealed state. This may also be accomplished by mating geometries of the peripheral walls of the first and the second member.

Another preferred embodiment is provided by a sealing element that further comprises a separate base member adapted to be accommodated in the passage of the wall and/or provided onto the wall and fastened thereto. Such a base member provides more robustness to the sealing member and easy of application. The base member also has a central aperture through which the cable assembly may be inserted. When attached to a wall, the central aperture of the base member aligns with the passage in the wall.

The base member is advantageously used in an embodiment of the sealing element wherein the peripheral wall of the first and/or the second member is adapted to be fastened to the base member.

The base member may have any suitable shape for accepting the first and/or second member. The engagement of the first and/or second member with the base member effectively locks the sealing element in the sealed state. When using a base member, this locking in the sealed state may also be accomplished by mating geometries of the peripheral walls of the first and/or the second member, and the base member. Preferably, the base member comprises a base plate that may be attached to the wall, for instance by a screw connection, or by a screw-less connection, such as a click connection.

Preferably, the base member also is dividable to accept a longitudinal part of the cable assembly inside the periphery of the base member, and re-unitable to enclose said longitudinal part.

A preferred embodiment provides a sealing element wherein the peripheral walls of the first member and the second member are adapted to be engaged with each other in the sealed state by a click connection.

The first and second member have a peripheral wall and therefore have a central aperture bounded by these peripheral walls. The sleeve provided between the first and the second member extends from the peripheral wall of the first element to the peripheral wall of the second member and, in the open state, encloses a volume of air (or other medium such as a fluid, for instance water) about equal to the surface area of each peripheral wall times an extension of the sleeve in the axial direction. The apertured first and second members are axially movable relative to each other between an open state in which they are positioned at a distance from each other and free from the peripheral wall of the other member delimiting its aperture. To obtain the sealed state, the first and/or the second member is twisted around the axial direction relative to each other causing the first and/or second member to move towards the other member and the sleeve, provided between the first and the second member, to seal against a cable assembly provided through the passage, and engaging the first and the second member with each other. In the sealed state, the first and second member are no longer able to twist relative to each other. As a result, a, preferably airtight, sealing is obtained around the cable assembly provided through the passage in the wall.

The twisting of the first and/or the second member relative to each other around the axial direction causes the sleeve to adopt a flattened hyperboloid configuration in the sealed state, at least when the sleeve is tubular, which is preferred. A tubular sleeve may have a circular, square, or rectangular cross-section, depending on the shape of the first and the second member.

The sleeve may be connected to the peripheral walls of the first and the second member in any appropriate manner. A practical connection is provided by tightly inserting an enlarged rim part of the sleeve in a groove provided in the peripheral walls of the first and the second member. Other methods such as mechanical connections (for instance clamps) or adhesive bonding may also be used. In order to improve airtightness of the sealing element in the sealed state, the sleeve preferably is connected to the substantially complete re-united periphery of the peripheral walls of the first and the second member. Substantially in this context means at least 80% of the re-united periphery, more preferably at least 90% of the re-united periphery.

The first and second member may be made by any suitable material, including metals, wood, ceramics, and polymers, the latter being preferred.

Another embodiment provides a sealing element wherein the sleeve comprises at least one slitted sleeve part, preferably slitted in a longitudinal direction of the sleeve. This provides a practical means for dividing the sleeve to accept a longitudinal part of the cable assembly inside the periphery of the first and the second member, as well as the sleeve. It has been surprisingly found that a dividable sleeve still provides an adequate air-tightness in the sealed state.

A practical embodiment of the sealing element according to the invention is characterised in that the peripheral wall of at least one of the first and second members comprises a plurality of interlockable parts, preferably two interlockable parts, more preferably interlockable pin-hole connections. The interlockable parts may be disengaged to divide the peripheral wall, and, when interlocked or re-united, provide the peripheral wall of the at least one of the first and second members, preferably both first and second member. This embodiment allows to readily insert an assembly of cables through the sealing element, or to add or remove cable from such assembly.

Another practical embodiment provides a sealing element wherein the peripheral wall of the first and the second member comprises at least two hinged (hingedly connected) parts that may be rotated around the hinge to divide the peripheral wall.

The same advantage may be reached in an embodiment of the invention that provides a sealing element wherein the sleeve comprises unconnected sleeve parts. Each sleeve part may be connected to an interlockable part of the at least one of the first and second member. It has turned out that a sleeve that comprises a plurality of unconnected sleeve parts still provides the desired degree of airtightness in the closed state of the sealing device, in which the sleeve parts are firmly wrapped around the cable assembly.

The sealed state according to the invention may be reached by twisting the first and/or second member in the open state relative to each other around the axial direction causing the first and second member to move towards each other and the sleeve to also twist and seal against a cable assembly provided through the passage, and engaging the first and the second member with each other. For instance, the sealed state may be reached by twisting the second member in the open state relative to the first member around the axial direction causing the second member to move towards the first member and the sleeve to also twist and seal against a cable assembly provided through the passage, and engaging the second member with the first member. The sleeve of the sealing element will also twist together with the second member since said sleeve is connected to the peripheral wall of the first and the second member, and the first member is in this embodiment immobilized within the passage of the wall.

In order to facilitate twisting of the sleeve around the axial direction of the sealing element, it is made of a flexible material. Such a flexible material preferably has a relatively low modulus and may be stretched to relatively high levels of elongation without breaking. Elongations up to 10-200% may be possible.

A preferred embodiment provides a sealing element wherein the flexible material in the sealed state is spring or elastically loaded to an average strain of at least 2%, This provides an improved seal of the twisted sleeve against the cable assembly.

A preferred sleeve of the sealing element is made of flexible material that comprises an elastomer. Another preferred material comprises a textile material such as cloth, fabric, non-woven, preferably all impregnated with an airtight material or provided with a coating.

It has turned out that the extended length of the sleeve between the first and the second member in the open state may be helpful in improving the sealing quality. The extended length of the sleeve is defined as the maximum distance between the first and the second member achievable without straining the sleeve in between. An optimal extended length of the sleeve may depend on the transverse dimensions of the first and the second member, i.e. on the diameter (in case of circular members), on the height or width (in case of square members), or on the maximum height or width (in case of rectangular members).

A preferred embodiment of the invention provides a sealing element wherein an extended length of the sleeve between the first member and the second member in the open state ranges from 0.9 to 1.1 times a transverse dimension of the first and/or the second member. Please note that the transverse dimensions of the first end the second member are preferably about the same for practical reasons, since they are required to be engageable with each other. However, the transverse dimensions may also differ.

An embodiment that may be used in a relatively large number of applications provides a sealing element wherein the extended length of the sleeve between the first member and the second member in the open state ranges from 30 to 200 mm.

It has turned out that an optimal sealing may be achieved with a sealing element according to an embodiment wherein the extended length of the sleeve between the first member and the second member in the open state is such that the sealed state may be reached by twisting the second member relative to the first member around the axial direction over an angle of from 90 to 360 degrees, preferably of 180 degrees. The starting position of the second member is such that the sleeve extends substantially untwisted between the first and the second member. In the starting position, the peripheral walls of the first and second member will generally be aligned, for instance the side edges of square peripheral walls of the first and the second member will extend about parallel to each other.

In view of the above disclosed embodiments, the extended length of the sleeve of the sealing element may also be chosen relatively short, for instance from 0.5 to 2 times a transverse dimension of the first and/or the second member. Such an embodiment may further improve airtightness of the sealing element in the sealed state but may require a substantial elastic loading of the sleeve. Preferably, the extended length of the sleeve of the sealing element ranges from 0.6 to 1.5 a transverse dimension of the first and/or the second member, and more preferably from 0.7 to 1.2 a transverse dimension of the first and/or the second member.

Selecting the extended length of the sleeve also allows selecting the length along which the sleeve in the twisted sealed state can cover or seal against the cable assembly. This length will generally be relatively small since the first and the second member engage in the sealed state, and both members may be relatively flat. Nonetheless, a small variation in covered or sealed length may be notable as far as sealing quality is concerned.

The sealing element according to the invention may be used in a plurality of walls, ranging from concrete walls, wooden walls, gypsum walls, typically used in building, but also metal walls, such as typically used in cabinets for accommodating devices such as electrical, electronic and optical devices.

Another aspect of the invention therefore relates to a wall comprising a passage for a cable assembly, which passage comprises a sealing element as claimed according to the invention.

In an embodiment, the wall comprises sheet metal with a wall thickness not exceeding 2.1 mm, such as used in housing for accommodating devices such as electrical, electronic and optical devices.

In yet another aspect of the invention, a housing is provided for accommodating devices such as electrical, electronic and optical devices, which housing comprises a sealing element provided in at least one of its walls.

In yet another aspect of the invention, a method is provided for at least partly sealing a passage for a cable assembly through a wall, the method comprising:

- providing a sealing element as claimed;
- providing a cable assembly through the passage and the divided sealing element and re-uniting said sealing element to enclose the cable assembly;

- bringing the sealing element from the open state, in which the first and the second member are disengaged and held at an axial distance from each other in an axial direction to the sealed state by twisting the first and/or the second member in the open state relative to each other around the axial direction causing the first and the second member to move towards each other and the sleeve to seal against the cable assembly provided through the passage, and
- engaging the first and the second member with each other.

Preferably, the sealing element is accommodated in the passage of the wall or provided onto the wall and fastened thereto.

Another embodiment provides a method further comprising the steps of accommodating a separate base member in the passage of the wall and/or provide it onto the wall and fasten it thereto. More preferably, the peripheral wall of the first and/or the second member is fastened to the base member.

Another aspect relates to a method for unsealing a sealed passage for a cable assembly through a wall using a sealing element as claimed, the method comprising:

- disengaging the first and the second member from each other;
- bringing the sealing element from the sealed state to the open state by untwisting the first and/or the second member in the closed state relative to each other around the axial direction causing the first and the second member to move away from each other and the sleeve to unseal from the cable assembly provided through the passage.

After unsealing, a method according to another embodiment further comprises the step of removing the cable assembly from the passage.

After unsealing, a method according to another embodiment further comprises the step of adding, replacing and/or removing a second cable assembly through the passage and the sealing element and bringing the sealing element in its sealed state again.

BRIEF DESCRIPTION OF THE FIGURES

The invention will now be further elucidated on the basis of a non-limitative embodiment, as shown in the attached schematic figures. In the figures.

DESCRIPTION OF EXEMPLARY EMBODIMENTS

Please note that the same numbering will be used for corresponding or similar features in different embodiments.

Figure 1:
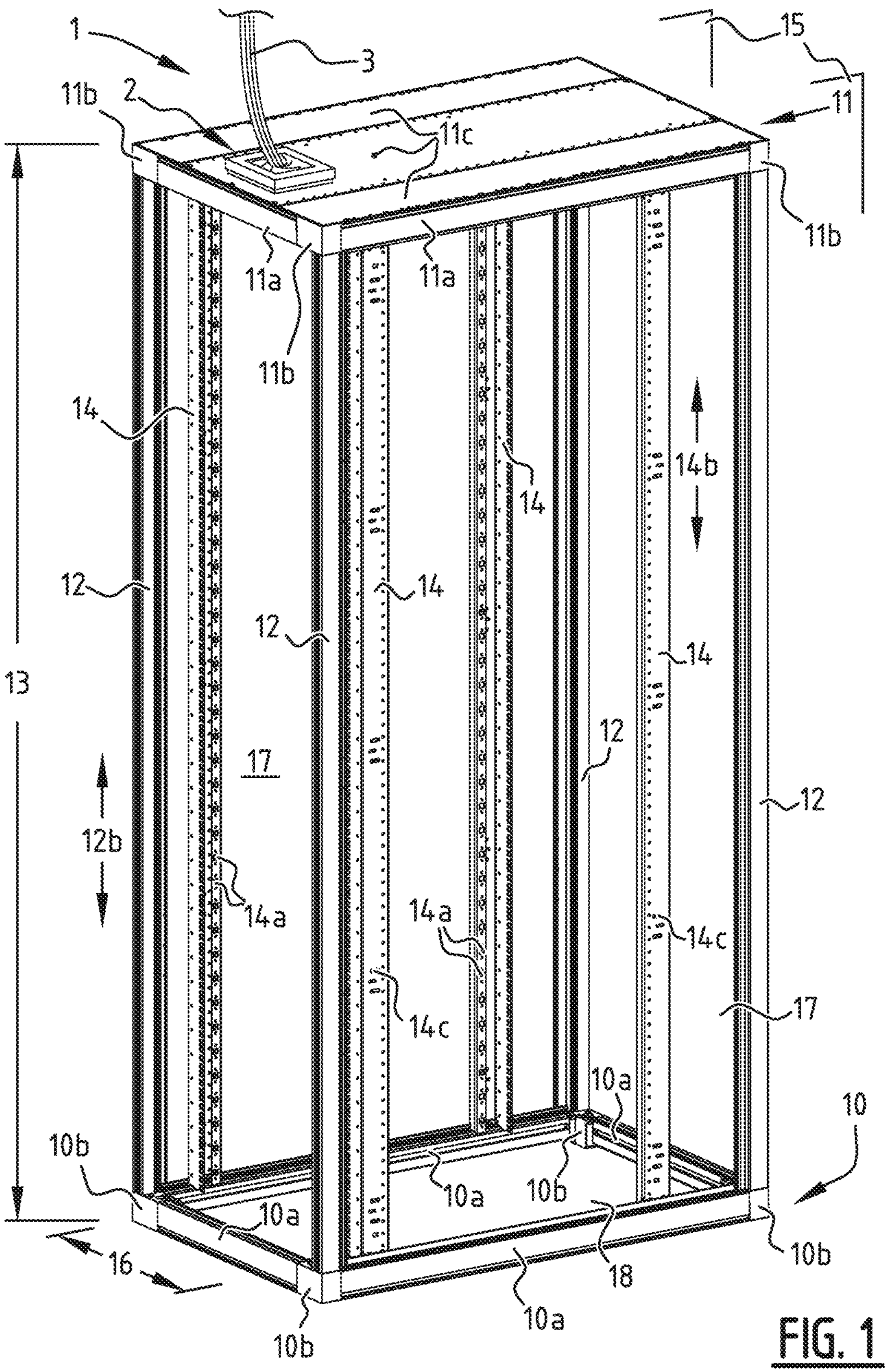
FIG. 1 represents a perspective view of a housing or rack in which the invention may be applicable.

Referring to FIG. 1, a rack 1 for accommodating devices such as electrical, electronic and optical equipment (not shown) according to an embodiment of the invention is shown. The rack comprises a rectangular floor 10 comprising four interconnected floor frame members 10*a* that extend between four floor corner elements 10*b*. Likewise, a rectangular roof 11 is provided, which comprises four interconnected roof frame members 11*a* that extend between four roof corner elements 11*b*. The floor 10 and roof 11 are held at a vertical distance 13 from each other by vertically extending side frame members 12, each side frame member 12 being provided between a floor corner element 10*b* and a roof corner element 11*b*. The frame members 10*a*, 11*a* and 12, and the corner elements (10*b*, 11*b*) together form a load bearing structure for accommodating equipment.

The roof 11 in the embodiment shown is provided with three contiguous roof plates 11*c* made from a thin sheet metal, preferably steel. The sheet metal plates 11*c* may have a thickness of about 1.0 mm, but may also have another thickness. In the embodiment shown in FIG. 1, two vertically oriented mounting rails 14 are provided in between each pair of side frame members 12, at least in two side planes 15 of the rack 1. Each mounting rail 14 is at an end thereof connected to a floor frame member 10*a*, and a roof frame member 11*a*, according to known practice. The 19-inch mounting rails 14 extend parallel to each other at a mutual standardized distance 16 of typically 17.7 inches. Each mounting rail 14 is further provided with a plurality of square openings 14*a*, extending along a longitudinal direction 14*b* of each mounting rail 14, and provided at equal height between mounting rails 14. Standardized, suitable equipment may be provided with fixation lips to be connected to the openings 14*a*, for instance by screws. In this way, multiple units of equipment (not shown) may be suspended on top of each other in the rack 1. The mounting rails 14 may be provided with other openings 14*c* for the same purpose, or for connecting to auxiliary parts of the rack 1, such as stiffening brackets, side walls (not shown) and the like. The rack 1 may, apart from the roof plates 11*c* that together form a roof wall part, be provided with other wall parts, such as side wall parts 17 or floor wall parts 18 to form a substantially closed cabinet. The walls (10, 11, 17 and 18) are shown transparent in FIG. 1 to make the construction of the rack 1 visible, but the walls (10, 11, 17, 18) may in reality be non-transparent. Surfaces of the roof plates 11*c*, and other wall parts, may be provided with a protective electrically insulating layer, such as a powder coating layer 111. Such a layer 111 protects the roof plates 11*c* but, on the other hand, electrically insulates the roof plates 11*c*, which may not be desirable for grounding purposes.

It is an important feature of the rack or server cabinet 1 to maintain conditioned (preferably cooled) air in the inside, to assure that a relatively large amount of conditioned air can reach the IT-equipment or other electrical, electronic, and optical devices, provided in the rack 1. On the other hand, electrical, electronic and/or optical cable assemblies 3 need to pass from the environment outside the rack 1 to the inside of the rack through a passage 4 made in one or more of the walls of the rack 1. Such passage 4 is provided with a sealing element 2 in accordance with the invention, as is schematically shown in FIG. 1. There, the sealing element 2 is provided in a roof wall part 11 of the rack or cabinet 1. This is for illustrative purposes only, and the sealing element 2, or more sealing elements 2, may be provided in other walls (10, 11, 17, 18) of the cabinet 1 as well.

Figure 2:
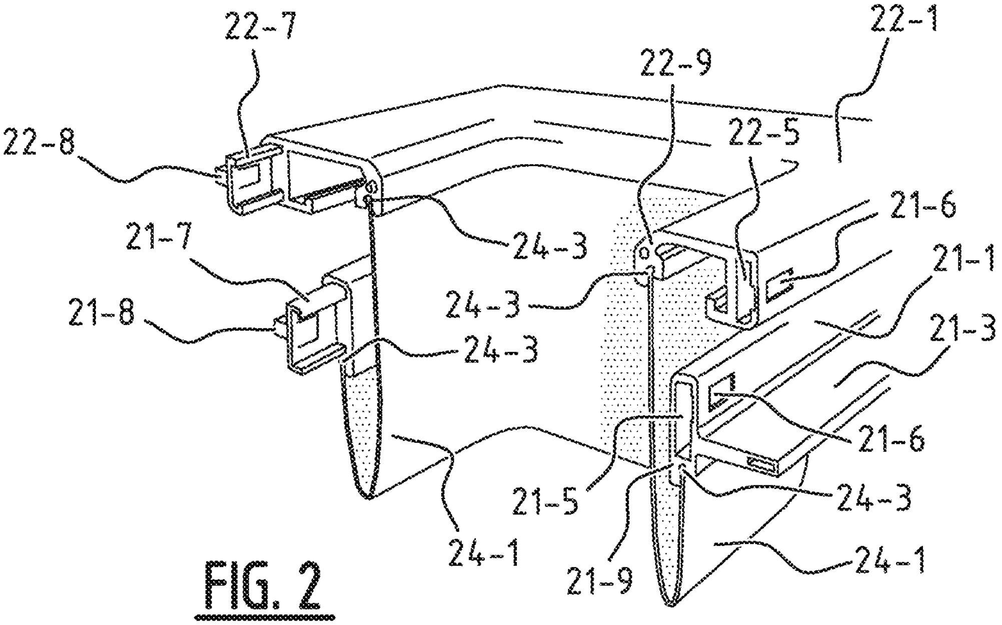
FIG. 2 represents a schematic perspective view of part of sealing element according to an embodiment of the invention.
Figure 3:
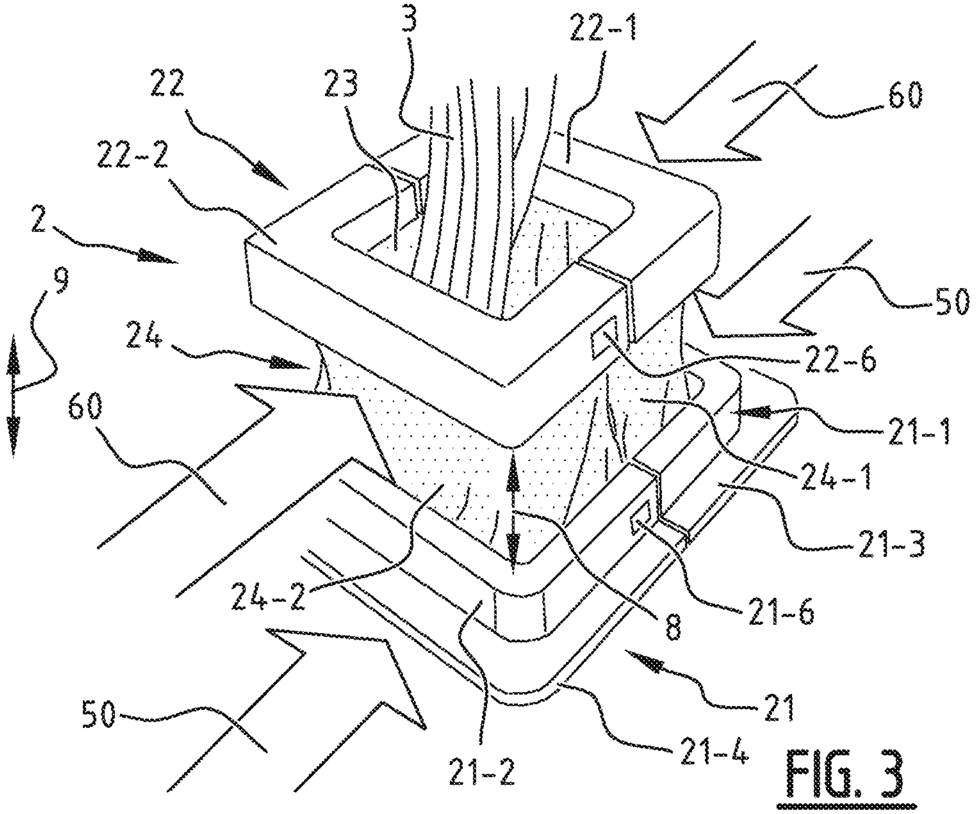
FIG. 3 represents a schematic perspective view of a sealing element according to an embodiment of the invention in the open state.
Figure 5:
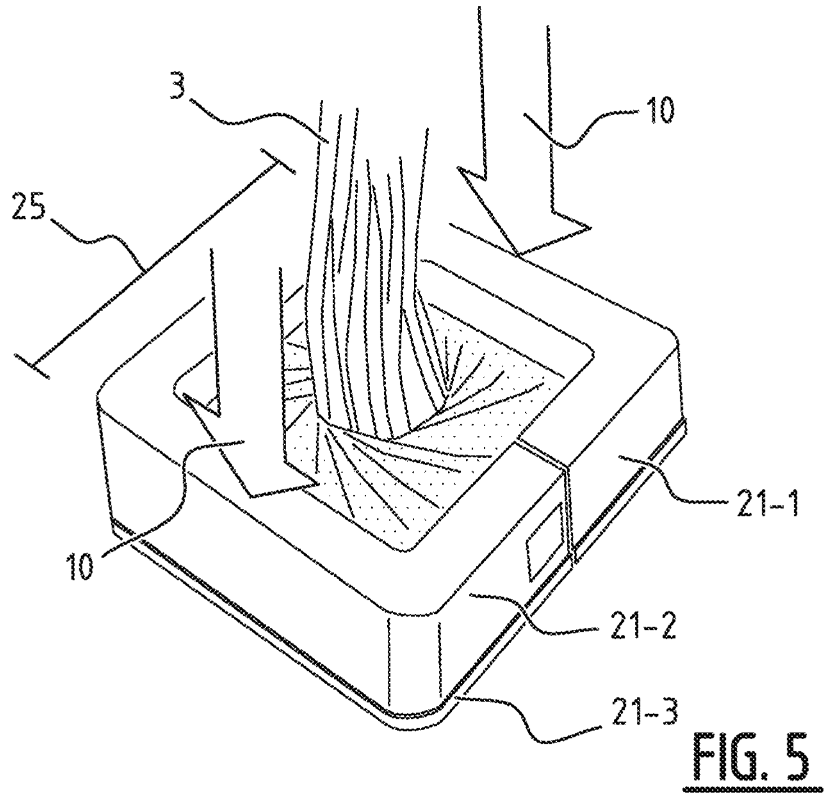
FIG. 5 represents a schematic perspective view of a sealing element according to an embodiment of the invention in the sealed state.

As shown in FIG. 3, the sealing element 2 comprises a first member 21 and a second member 22 that are mutually coupled by a sleeve 23 made of elastomeric material. The sleeve 24 at one side is connected to a peripheral wall (21-1, 21-2) of the first member 21, and at an opposite side to a peripheral wall (22-1, 22-2) of the second member 22. The peripheral wall (21-1, 21-2) of the first member is adapted to be accommodated in the passage 4 of the wall (10, 11, 17, 18) of the cabinet 1 and fastened thereto. To this end, the peripheral wall (21-1, 21-2) may be provided with an outwardly extending rim (21-3, 21-4) and upstanding wall parts extending parallel to an inner surface of the passage 4 (not shown in FIGS. 2 and 3). In the embodiment shown, the peripheral wall (21-1, 21-2) of the first member 21 comprises two interlockable parts 21-1 and 21-2 that in the assembled state shown in FIG. 3 form a closed peripheral wall (21-1, 21-2) that encloses a central aperture 23. In the same manner, the second member 22 also has a peripheral wall (22-1, 22-2) that is adapted to be engaged with the peripheral wall (21-1, 21-2) of the first member 21 in a sealed state, as shown in FIG. 5. In the embodiment shown, the peripheral wall (22-1, 22-2) of the second member 22 also comprises two interlockable parts 22-1 and 22-2 that in the assembled state shown in FIG. 3 form a closed peripheral wall (22-1, 22-2) that encloses the same central aperture 23.

In accordance with the interlockable two parts (21-1, 21-2) and (22-1, 22-2) of the first and second member respectively, the sleeve 24 also comprises two unconnected sleeve parts 24-1 and 24-2 that may optionally be attached to each other, but preferably remain unconnected. A first sleeve part 24-1 is connected to the interlockable parts 21-1 and 22-1 of the first and second member respectively, while a second sleeve part 24-2 is connected to the interlockable parts 21-2 and 22-2 of the first and second member respectively.

A possible way the two interlockable parts (21-1, 21-2) of the first member 21 and the two interlockable parts (22-1, 22-2) of the second member 22 may be embodied is shown in FIG. 2. Only one interlocking part 21-1 of the first member 21 is shown, as well as only one interlocking part 22-1 of the second member 22. It is to be understood that the second interlocking part 21-2 of the first member 21 has the same shape as the first interlocking part 21-1 of the first member 21. Also, the second interlocking part 22-2 of the second member 22 has the same shape as the first interlocking part 22-1 of the second member 22.

The interlockable part 21-1 of the first member 21 has a receiving hole 21-5 in an end face thereof and an opening 21-6 in a side face of the first member 21. An opposite side of the interlockable part 21-1 of the first member 21 has a protruding pin 21-7 in an end face thereof, which pin 21-7 is provided with a projection 21-8. Although not shown, it is to be understood that the second interlockable part 21-2 of the first member 21 is embodied in the same way and has the same features, namely a receiving hole in an end face thereof, an opening in a side face of the first member 21, and at an opposite side of the interlockable part 21-2 of the first member 21 a protruding pin in an end face thereof, which is provided with a projection. The two interlockable parts (21-1, 21-2) may be interlocked by providing the protruding pin 21-7 of one of the interlockable parts (21-1, 21-2) into the receiving hole 21-5 of the other interlockable part (21-1, 21-2). The projection 21-8 fits inside the opening 21-6 in the side wall and locks the two interlockable part (21-1, 21-2) to form the assembled state of the first member 21 by pushing the two interlocking parts (21-1, 21-2) against each other according to arrows 50, as shown in FIG. 3.

As is also apparent from FIG. 2, the sleeve part 24-1 may be connected to the peripheral walls (21-9, 22-9) of the first interlocking parts (21-1, 22-1) of the first member 21 and the second member 22 respectively by inserting a rim 24-3 of the sleeve part 42-2 into a groove provided in each peripheral wall (21-9, 22-9), and optionally adhesively bond the rim 42-3 to each groove. In the same way, the sleeve part 42-2 may be connected to the peripheral walls of the second interlocking parts (21-2, 22-2).

Similarly to the first member 21, the interlockable part 22-1 of the second member 22 has a receiving hole 22-5 in an end face thereof and an opening 22-6 in a side face of the second member 22. An opposite side of the interlockable part 22-1 of the second member 22 has a protruding pin 22-7 in an end face thereof, which pin 22-7 is provided with a projection 22-8. Although not shown, it is to be understood that the second interlockable part 22-2 of the second member 22 is embodied in the same way and has the same features, namely a receiving hole in an end face thereof, an opening in a side face of the second member 22, and at an opposite side of the interlockable part 22-2 of the second member 22 a protruding pin in an end face thereof, which is provided with a projection. The two interlockable parts (22-1, 22-2) may be interlocked by providing the protruding pin 22-7 of one of the interlockable parts (22-1, 22-2) into the receiving hole 22-5 of the other interlockable part (22-1, 22-2). The projection 22-8 fits inside the opening 22-6 in the side wall and locks the two interlockable part (22-1, 22-2) to form the assembled state of the second member 22 by pushing the two interlocking parts (22-1, 22-2) against each other according to arrows 60, as shown in FIG. 3.

In the assemble state, the two sleeve parts (24-1, 24-2) together form a sleeve 24 that covers the substantially complete periphery of the first and second members (21, 22), and therefore encloses the central aperture 23 substantially completely.

It should further be noted that the assembly of cables 3 may actually encompass one cable only or may be embodied as a plurality of cables (as shown) that are running parallel to each other, or that are twisted around each other. It is particularly surprising that the sealing element according to the invention can provide a substantially airtight sealing in the case of a plurality of cables. Indeed, in such cables, air passages may be present between the cables, and the invented sealing element apparently is able to close these air passages.

Figure 4:
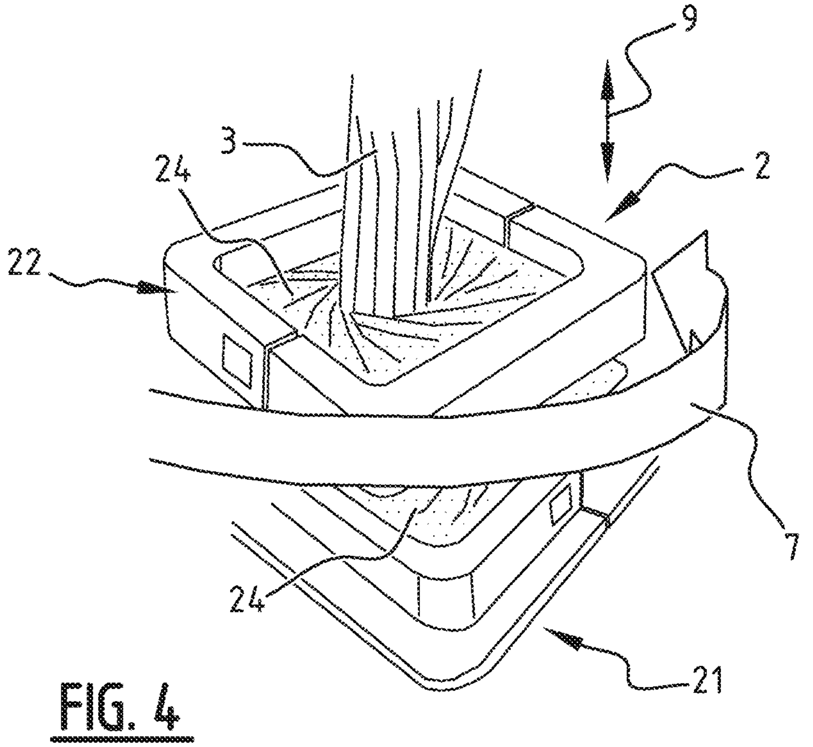
FIG. 4 represents a schematic perspective view of a sealing element according to an embodiment of the invention in between the open state and the sealed state.

As shown in FIGS. 3 to 5, the sealing element 2 may be switched between an open state (see FIG. 3), wherein the first member 21 and the second member 22 are disengaged and held at an axial distance 8 from each other in an axial direction 9, and a sealed state shown in FIG. 5.

In the open state, the first member 21 and the second member 22 may be aligned such that the sleeve 24 extending in between these members (21, 22) is substantially untwisted and the first member 21 and second member 22 are held at an extended distance 8 in an axial direction 9 from each other. This extended distance 8 is achieved by pulling the first member 21 and the second member 22 apart from each other such that the sleeve 24 is straightened without however straining the sleeve 24. As may be apparent, the extended length of the sleeve 24 between the first member 21 and the second member 22 in the open state is about equal to a transverse dimension 25 of the first and the second members (21, 22), such as the length of a side edge of the square first and second members (21, 22).

The sealed state shown in FIG. 5 may be obtained by twisting or rotating the second member 22 from the open state relative to the first member 21 around the axial direction 9 according to the arrow 7 (FIG. 4). Although FIG. 4 shows a counterclockwise rotation, the rotation may also be carried out in a clockwise direction. The rotation in the direction 7 causes the second member 22 to move towards the first member 21 (shortening the distance 8) and the sleeve 24 (or the two sleeve parts 24-1, 24-2) to also twist in the same direction 7 and seal against the cable assembly 3 provided through the passage 4 and the central aperture 23. The extended length 8 of the sleeve 24 between the first member 21 and the second member 22 in the open state may be chosen such that the sealed state may be reached by twisting the second member 22 relative to the first member 21 around the axial direction 9 over an angle of 180 degrees.

As shown in FIG. 5, the second member 22 is finally engaged with the first member 21. Although not shown in detail, the peripheral walls of the first member 21 and the second member 22 may engage through a click connection, like the ones described above to connect the interlockable parts of the first and second members (21, 22) to each other. The connection may be achieved by pressing the second member 22 onto the first member 21 in the direction of the arrows 10.

The unsealing of a sealed passage for the cable assembly 3 through a wall 11 using a sealing element 2 as claimed may easily be performed by disengaging the second member 22 from the first member 21, then bringing the sealing element 2 from the sealed state of FIG. 5 to the open state of FIG. 3 by untwisting the second member 22 in a direction opposite to the rotation direction 7 around the axial direction 9 causing the second member 22 to move away from the first member 21 and the sleeve 24 (or the two sleeve parts 24-1, 24-2) to unseal from the cable assembly 3 provided through the passage 4.

If desired, the cable assembly 3 may be removed from the passage 4 and the central aperture 23. Another possibility is to provide a second cable assembly 3 through the central aperture 23 while the sealing element is in the open state sage and the bring the sealing element 2 to the closed state again, as disclosed above.

It should further be noted that the first member 21 is adapted to be accommodated in a passage provided in a wall. The wall may be of different type, and the type of wall will define the way the first member is connected to the wall, for instance by clamping, adhesive bonding or by a screw connection. One skilled in the art will be able to select the appropriate method of connecting the first member to the wall.

Figure 6:
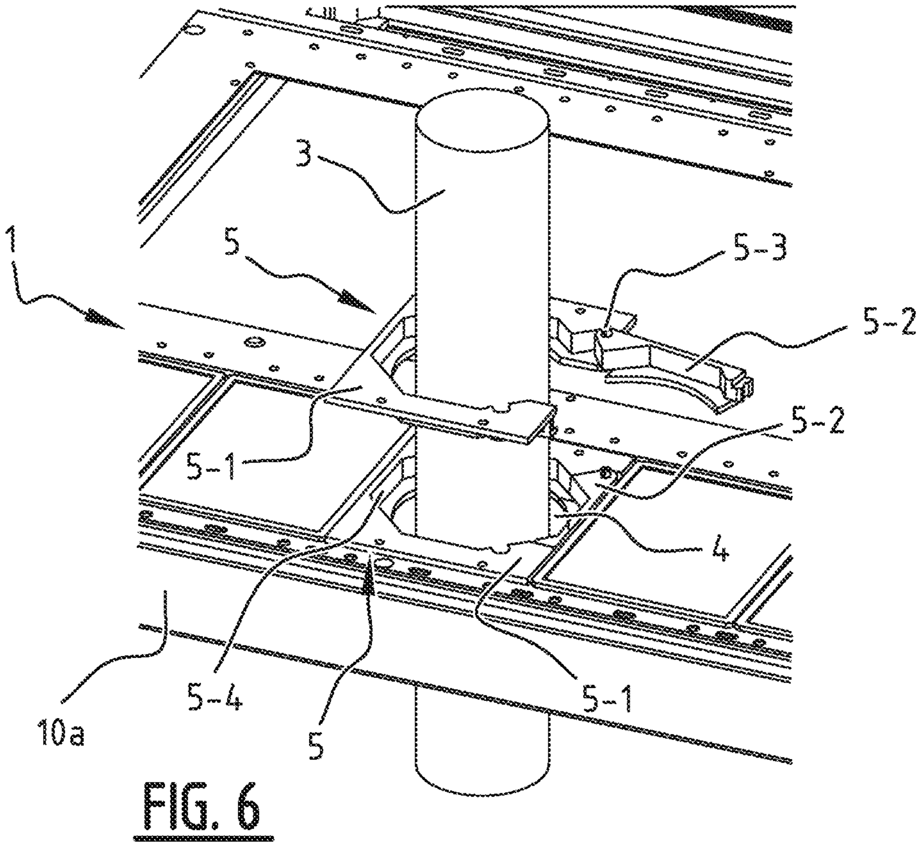
FIG. 6 represents a schematic perspective view of a base member provided around a cable assembly according to an embodiment of the invention.
Figure 7:
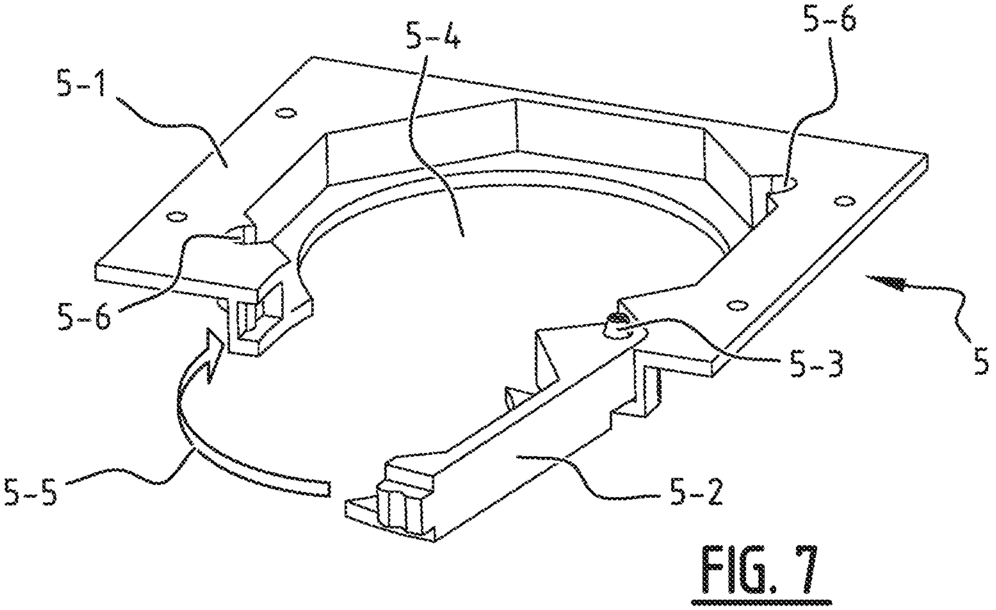
FIG. 7 represents a schematic perspective view of the base member used in FIG. 6.

Referring to FIG. 6, a schematic perspective view of a base member 5 provided around a cable assembly 3 according to an embodiment of the invention is shown. The base member 5 has a plate-like configuration and comprises two hingedly connected parts (5-1, 5-2) that may be rotated around the hinge 5-3 to divide the peripheral wall (5-1, 5-2) of the base element 5 to be able to accept the cable assembly 3, as shown. The base member parts (5-1, 5-2) may be closed (or re-united) to form a continuous peripheral wall (5-1, 5-2), by rotating the part 5-2 around the hinge 5-3 in the direction 5-5, as shown in FIG. 7. In the re-united state it may be lowered along the cable assembly 3 to be accommodated into a floor of a cabinet 1, as shown by the lower position of the base member 5 in FIG. 6. A central aperture 5-4 aligns with a passage 4 in the floor of the cabinet 1. Please note that the base member in the re-united state has a central cavity 5-4 bounded by the peripheral wall (5-1, 5-2) in the form of an octagon. Obviously, the octagon may also be another polygon.

Figure 8A:
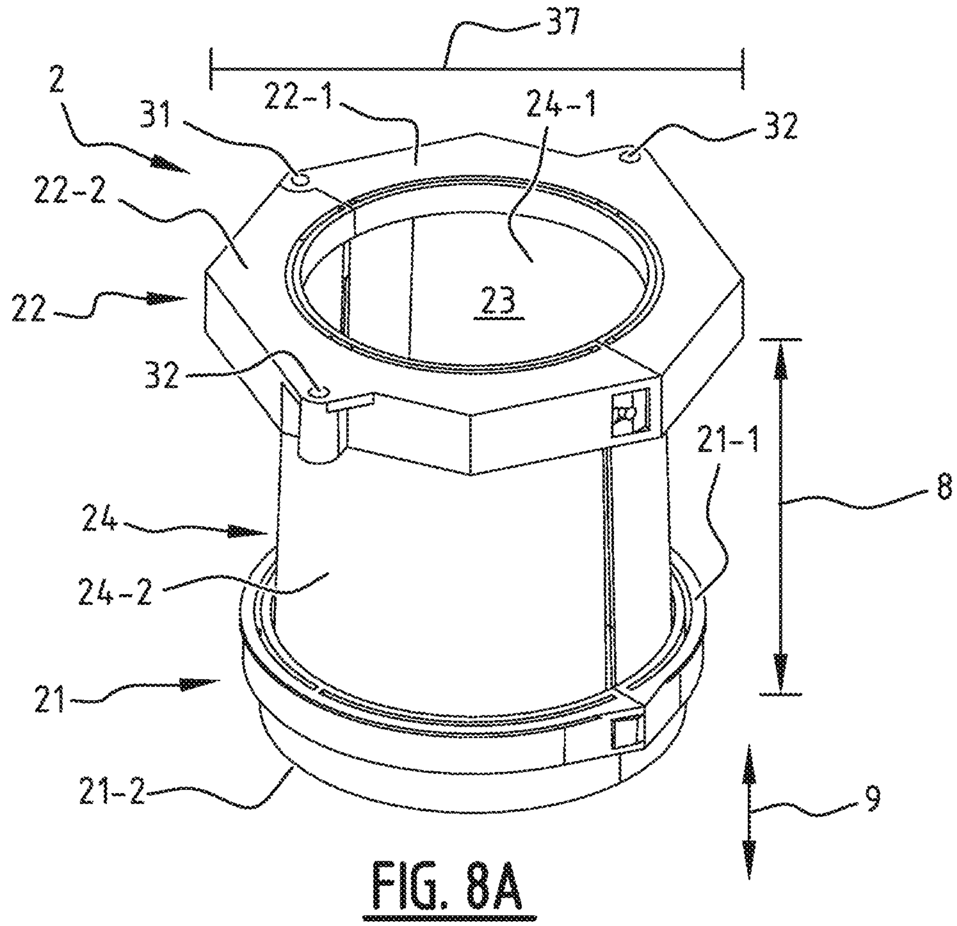
FIGS. 8A-8C represent a schematic view of a sealing element according to another embodiment of the invention in an open state, a closed state and the closed state, viewed from below.
Figure 8B:
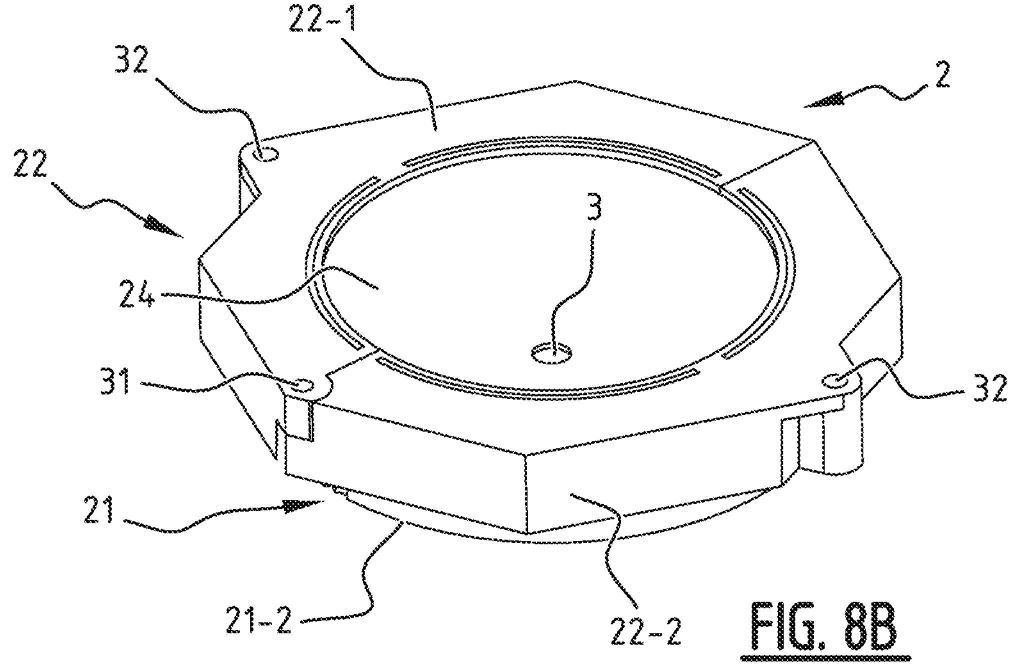
Figure 8C:
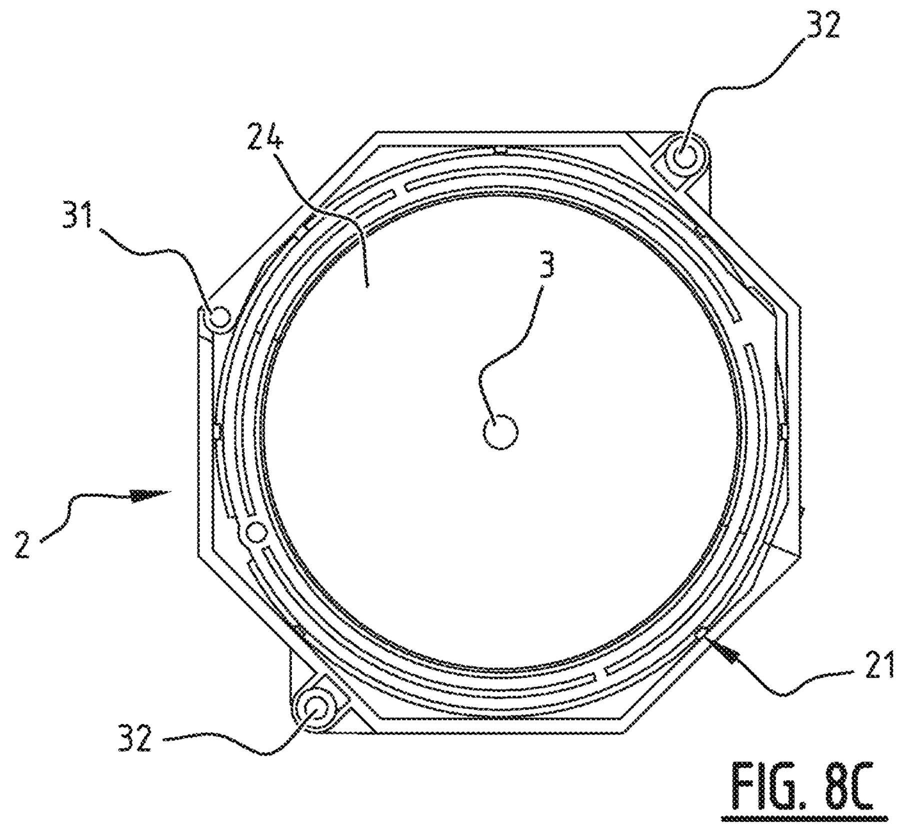

The base element 5 may be used in conjunction with the sealing element 2 shown in FIGS. 8A to 8E. As shown in FIG. 8A, the sealing element 2 of this embodiment comprises a first member 21 and a second member 22 that are mutually coupled by a sleeve 24 made by coated cloth or an elastomeric material. In the embodiment shown, the peripheral wall (21-1, 21-2) of the first member 21 comprises two dividable and interlockable parts 21-1 and 21-2 that in the assembled state shown in FIGS. 8A-8C form a closed peripheral wall (21-1, 21-2) that encloses a central aperture 23. In the same manner, the second member 22 also has a dividable peripheral wall (22-1, 22-2) comprising two parts (22-1, 22-2) that may be rotated around a hinged connection 31. The second member 22 in the re-united state is adapted to be engaged with the peripheral wall (21-1, 21-2) of the first member 21 in a sealed state, as shown in FIGS. 8B and 8C. In the embodiment shown, the peripheral wall (22-1, 22-2) of the second member 22 also comprises two interlockable parts 22-1 and 22-2 that in the assembled state shown in FIG. 3 form a closed peripheral wall (22-1, 22-2) that encloses the same central aperture 23. The sleeve 24 at one side is connected to a peripheral wall (21-1, 21-2) of the first member 21, and at an opposite side to a peripheral wall (22-1, 22-2) of the second member 22. The sleeve 24 comprises two unconnected sleeve parts 24-1 and 24-2 that provide two longitudinal slits in the sleeve 24. A first sleeve part 24-1 is connected to the interlockable parts 21-1 and 22-1 of the first and second member respectively, while a second sleeve part 24-2 is connected to the interlockable parts 21-2 and 22-2 of the first and second member respectively.

The peripheral wall (22-1, 22-2) of the second member is adapted to be accommodated in the central cavity 5-4 bounded by the octagonal peripheral wall (5-1, 5-2) of the base member 5 shown in FIGS. 6 and 7. Thereto, the outside contour of the peripheral wall (22-1, 22-2) of the second member also has the form of an octagon that mates with the octagonal form of the central cavity 5-4 of the base member 5. Such mating of the second member 22 and the base member 5 locks the sealing element 1 into its correct sealed state. The second member 22 may then be secured to the base member 5 by providing a screw connection through screw holes 32, provided in parts 22-2 and 22-2. These engage with recesses 5-6 provided in the base element 5 (FIG. 7).

Figure 8D:
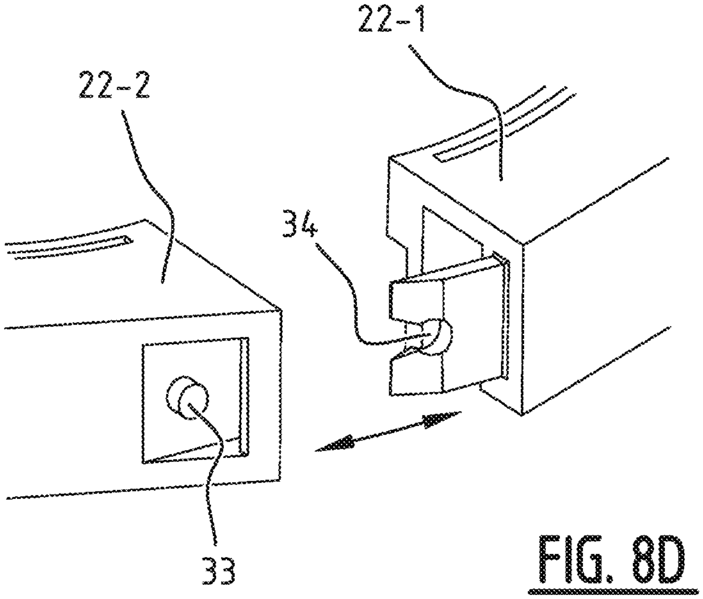
FIGS. 8D and 8E represent schematic views of details of the sealing element of FIGS. 8A-8C.

As shown in FIG. 8D, any interlockable parts (22-1, 22-2) may be interlocked or re-united by a locking arrangement comprises a pin 33 and a hole 34 to connect with the pin 33 in the re-united state. The same way of connection may be used for interlocking the parts (21-1, 21-2) of the first member 21.

Figure 8E:
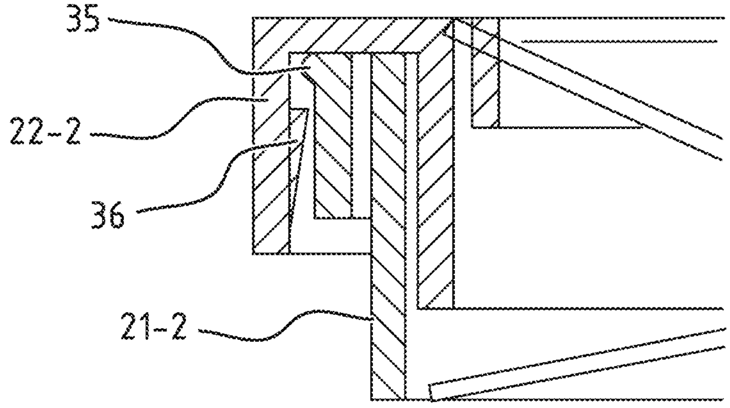

FIG. 8E shows a possible way of engaging the first member 21 with the second member 22 in cross-section. The second member 22-2 (or 22-1) is provided with a hollow peripheral wall into which a snapping element 36 is fitted along at least a part of the periphery. The snapping element 36 retracts when an upstanding peripheral wall part of the first member 21-2 (or 21-1) is pushed inside the hollow peripheral wall. A protrusion 35 locks the first member 21-2 with respect to the second member 22-2, as shown in FIG. 8E.

As shown in FIGS. 8A-8C, the sealing element 2 may be switched between an open state (as shown in FIG. 8A), wherein the first member 21 and the second member 22 are disengaged and held at an axial distance 8 from each other in an axial direction 9, and a sealed state, as shown in perspective view in FIG. 8B, and from below in FIG. 8C.

In the open state, the first member 21 and the second member 22 may be aligned such that the sleeve 24 extending in between these members (21, 22) is substantially untwisted and the first member 21 and second member 22 are held at an extended distance 8 in an axial direction 9 from each other. This extended distance 8 is achieved by pulling the first member 21 and the second member 22 apart from each other such that the sleeve 24 is straightened without however straining the sleeve 24. As may be apparent, the extended length of the sleeve 24 between the first member 21 and the second member 22 in the open state is about equal to a transverse dimension of the first and the second members (21, 22), such as the diameter 37 of the circular first and second members (21, 22).

The sealed state shown in FIGS. 8B and 8C may be obtained by twisting or rotating the second member 22 from the open state relative to the first member 21 around the axial direction 9. The rotation causes the second member 22 to move towards the first member 21 (shortening the distance 8) and the sleeve 24 (or the two sleeve parts 24-1, 24-2) to also twist and seal against the cable assembly 3 provided through the passage 4 and the central aperture 23. The extended length 8 of the sleeve 24 between the first member 21 and the second member 22 in the open state may be chosen such that the sealed state may be reached by twisting the second member 22 relative to the first member 21 around the axial direction 9 to achieve locking by the mating surfaces of the second member 22 and the base member 5, as described above.

As shown in FIGS. 8B and 8C, the second member 22 is finally engaged with the first member 21. The peripheral walls of the first member 21 and the second member 22 are engaged in the sealed state. The second member 22 is then also fastened to the base plate though a screw connection 32 for instance, or through any other connection, for instance a connection that does not require any tools, such as a screw driver.

Figure 9:
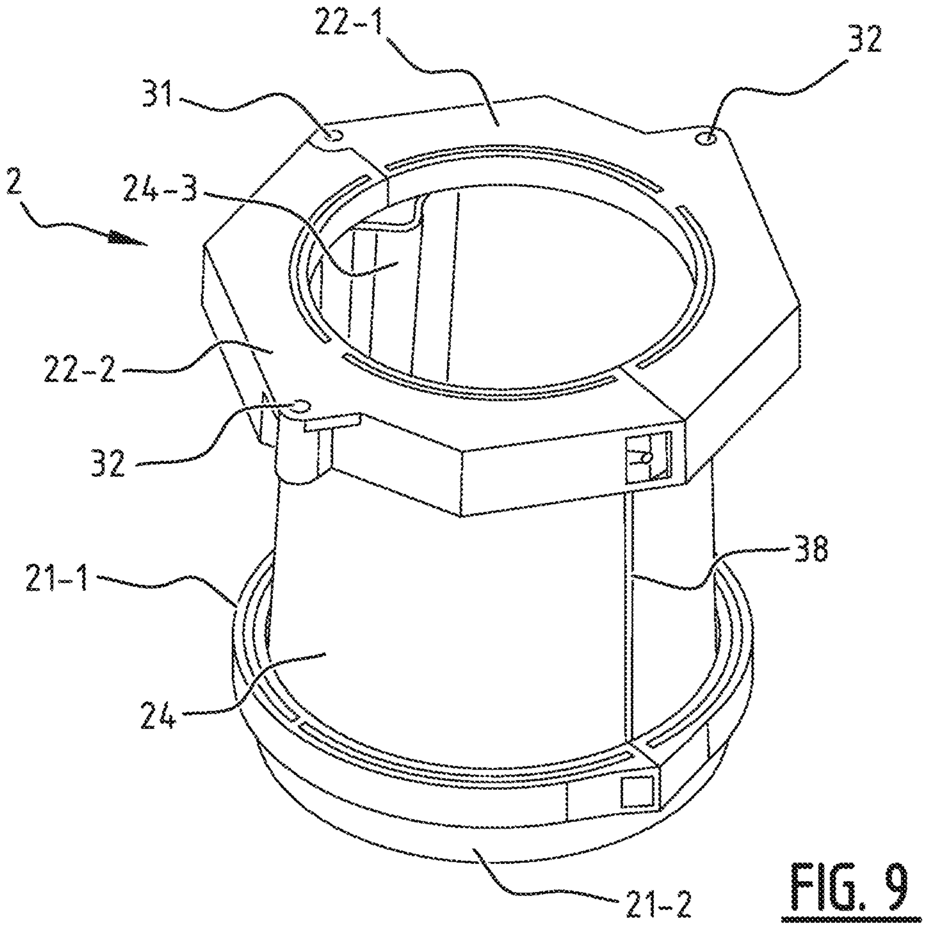
FIG. 9 represents a schematic view of a sealing element according to yet another embodiment of the invention in an open state.

FIG. 9 represents a schematic view of a sealing element 2 according to yet another embodiment of the invention in an open state. The sealing element 32 is similar to the one shown in FIGS. 8A-8E with the only difference that the sleeve 24 actually consists of a single sheet of material that is formed into a cylindrical sleeve leaving one longitudinal slit 38 only in the open state. To be able to rotate the sleeve 24 (and the first and second member (21, 22)) around the hinge 31, the sleeve 24 is provided with some excess material to form a bulged in part 24-3. This embodiment may be beneficial in increasing airtightness further in the closed state of the sealing element 2. The slitted sleeve 24 of this embodiment is dividable along the slit 38 by rotating it to an opened state around the hinge 31.

Figure 10:
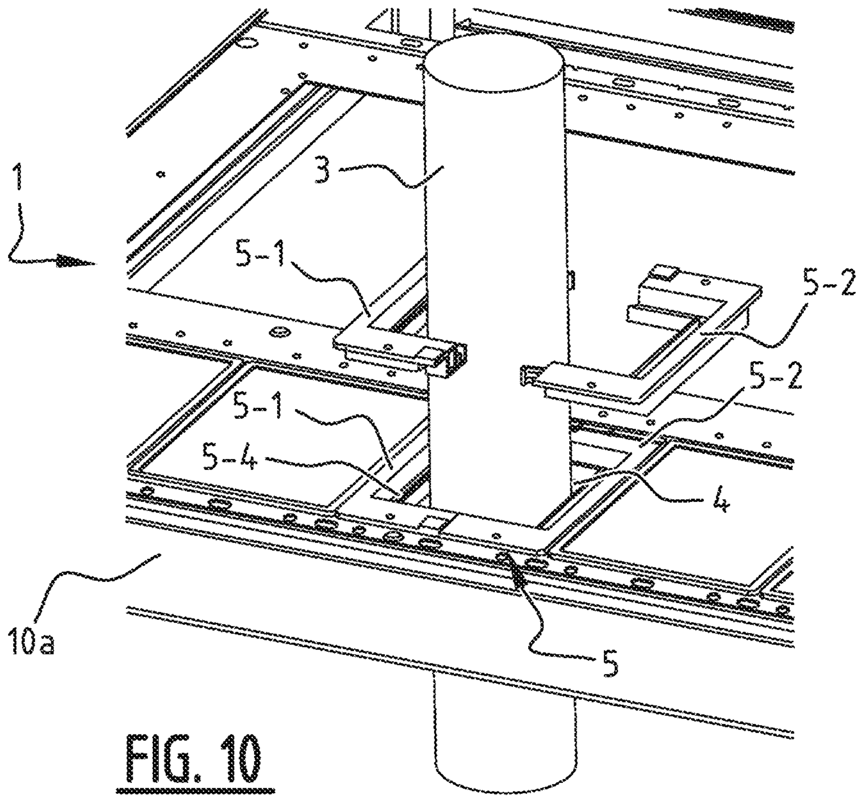
FIG. 10 represents a schematic perspective view of a base member provided around a cable assembly according to yet another embodiment of the invention.

Referring to FIG. 10, a schematic perspective view of a base member 5 provided around a cable assembly 3 according to yet another embodiment of the invention is shown. The base member 5 has a plate-like configuration and comprises two separate parts (5-1, 5-2) that may be disengaged (as shown) to divide the peripheral wall (5-1, 5-2) of the base element 5 to be able to accept the cable assembly 3, as shown. The base member parts (5-1, 5-2) may be closed (or re-united) to form a continuous peripheral rectangular wall (5-1, 5-2), by bringing the parts 5-1 and 5-2 together, and interlocking the parts (5-1, 5-2), for instance by a snapping connection, using cooperating lips 5-7 and hollows 5-8, as shown. In the re-united state, the base member 5 may be lowered along the cable assembly 3 to be accommodated into a floor of a cabinet 1, as shown by the lower position of the base member 5 in FIG. 10. A central aperture 5-4 aligns with a passage 4 in the floor of the cabinet 1. Please note that the base member in the re-united state has a central cavity 5-4 bounded by the peripheral wall (5-1, 5-2) in the form of a rectangle or square.

Figure 11:
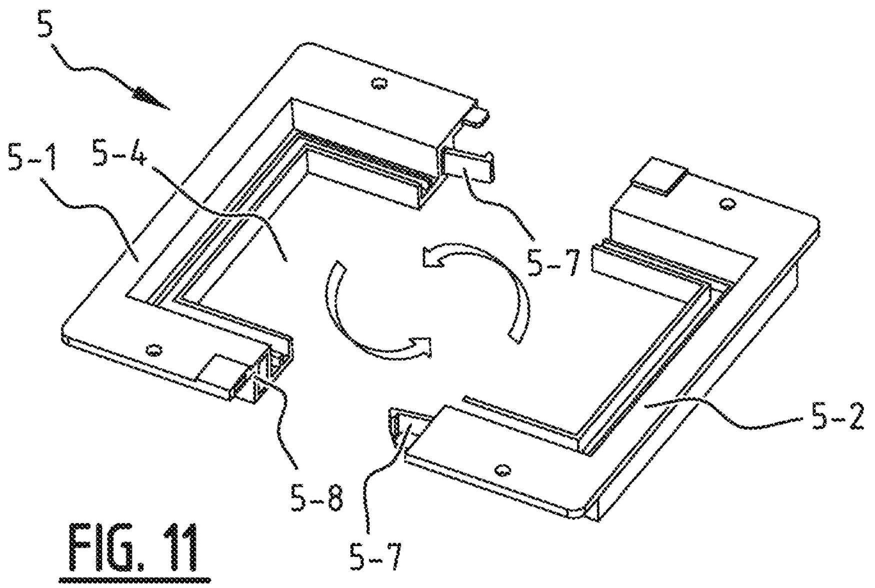
FIG. 11 represents a schematic perspective view of the base member used in FIG. 10.
Figure 12:
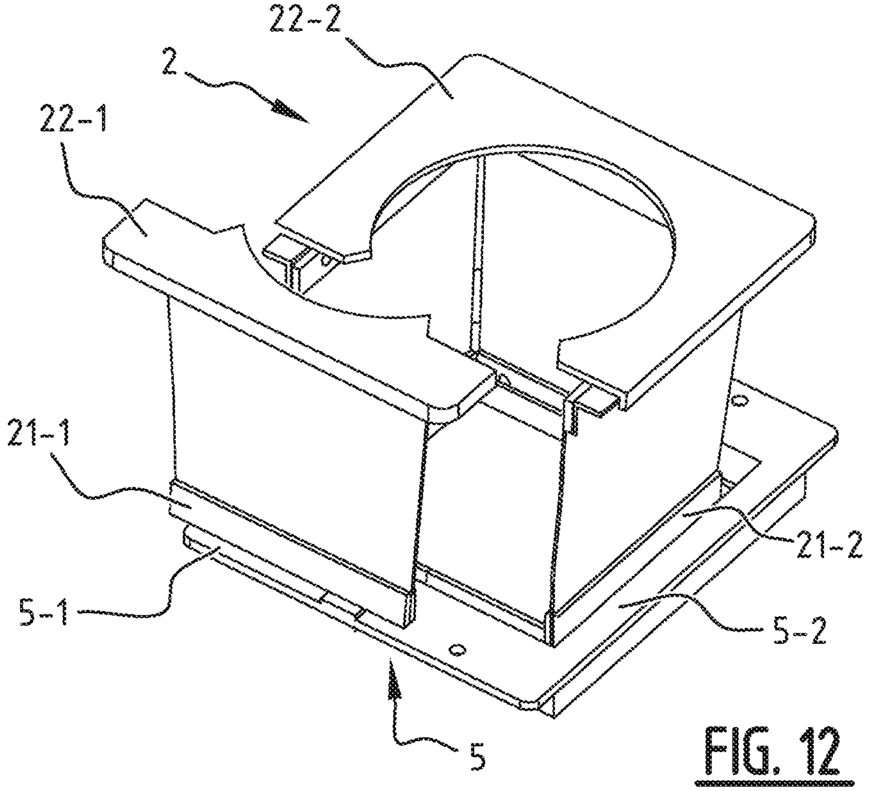
FIG. 12 represents a schematic view of a sealing element according to yet another embodiment of the invention in an open state.

The base element 5 as shown in FIGS. 10 and 11 may be used in conjunction with the sealing element 2 shown in FIG. 12. This embodiment of the sealing element 2 comprises the base member 5 to which is attached a first member 21 in the form of separate linear members (21-1, 21-2, . . . ) that are each connected to the base member 5. A second member 22 is provided in two dividable parts (22-1, 22-2), one of which (22-1) is linear and connectable to the part 22-2. The sleeve 24 comprises several flat parts (24-1, 24-2, . . . ) that extend between the first and the second member (21, 22). In an assembled state, the sealing element 2 forms a cube surrounding the cable assembly 3 (not shown in FIG. 12). The sealing element 2 of this embodiment may be provided in the sealed state in the same manner as disclosed for the other embodiments. In the sealed state, the second member 22 is fastened to the base member 5.

Figure 13:
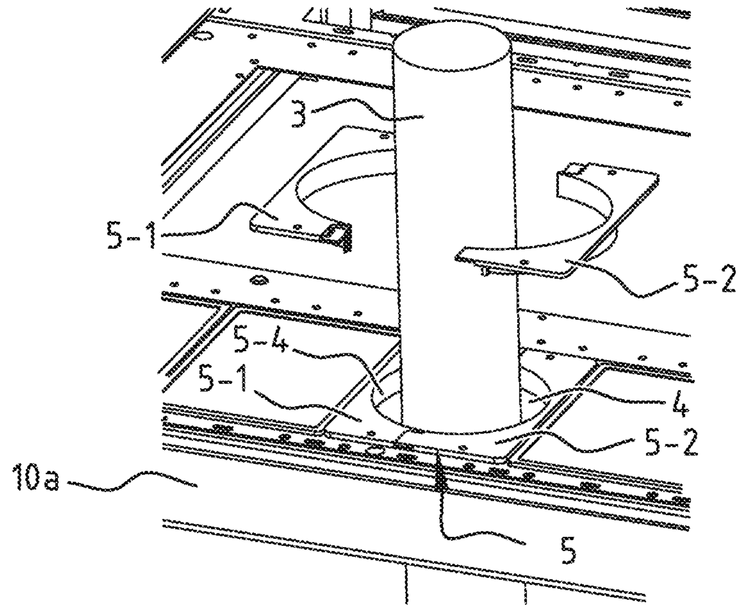
FIG. 13 represents a schematic perspective view of a base member provided around a cable assembly according to yet another embodiment of the invention.

Referring to FIG. 13, a schematic perspective view of a base member 5 provided around a cable assembly 3 according to yet another embodiment of the invention is shown. The base member 5 has a plate-like configuration and comprises two separate parts (5-1, 5-2) that may be disengaged (as shown) to divide the peripheral wall (5-1, 5-2) of the base element 5 to be able to accept the cable assembly 3, as shown. The base member parts (5-1, 5-2) may be closed (or re-united) to form a continuous peripheral wall (5-1, 5-2), by bringing the parts 5-1 and 5-2 together, and interlocking the parts (5-1, 5-2), for instance by a pin-hole, using horizontal lips 5-9 for horizontal alignment, as shown. In the re-united state, the base member 5 may be lowered along the cable assembly 3 to be accommodated into a floor of a cabinet 1, as shown by the lower position of the base member 5 in FIG. 13. A central aperture 5-4 aligns with a passage 4 in the floor of the cabinet 1. Please note that the base member in the re-united state has a central cavity 5-4 bounded by a circular peripheral wall (5-1, 5-2). The outside contour of the peripheral wall (5-1, 5-2) is rectangular or square.

Figure 15:
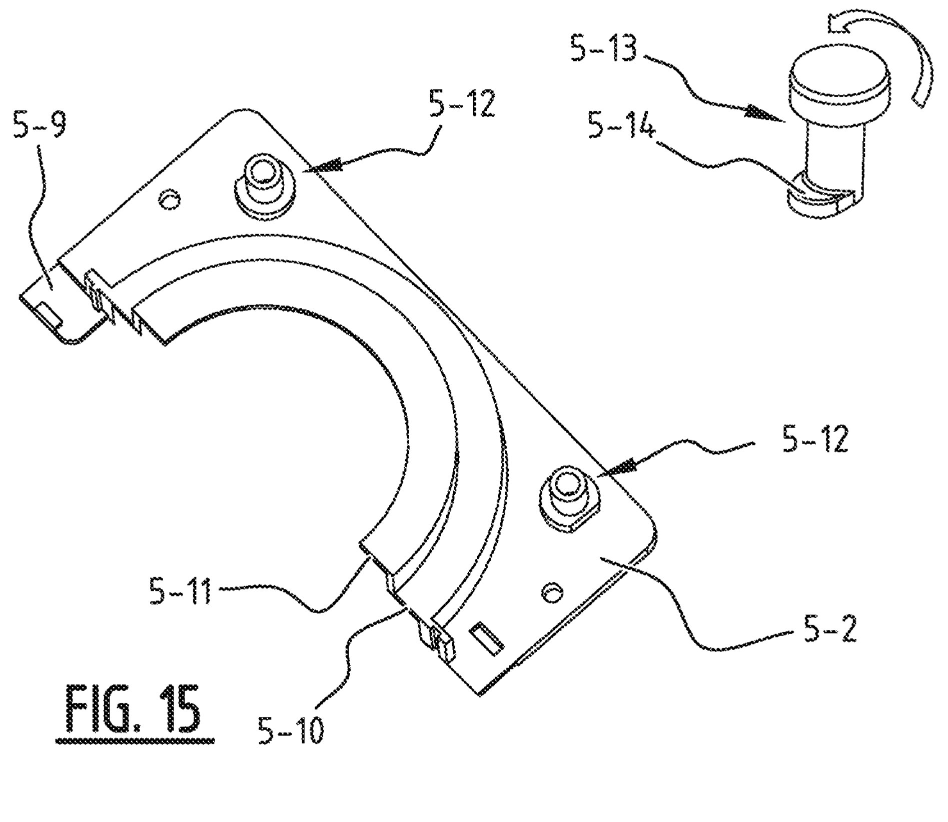
FIG. 15 represents a schematic perspective view from below of part of a base member according to yet another embodiment of the invention.

As shown in FIG. 15 in a schematic perspective view from below, another embodiment of part of a base member 5 has a stepped bottom (5-10, 5-11) offering several support surfaces at different vertical levels. This embodiment makes the base member 5 more versatile, such that it may be used for fixation onto or insertion into several substrates or walls. This embodiment also shows a manner of fixating the base member 5 to a wall by using receiving holes 5-12 for twisting fixation elements 5-13, provided with a locking foot part 5-14. This way of fixation can be done by hand and does not require the use of tools, such as a screw driver. It should be noted that this way of fixation can be used in all embodiment disclosed herein.

Figure 16:
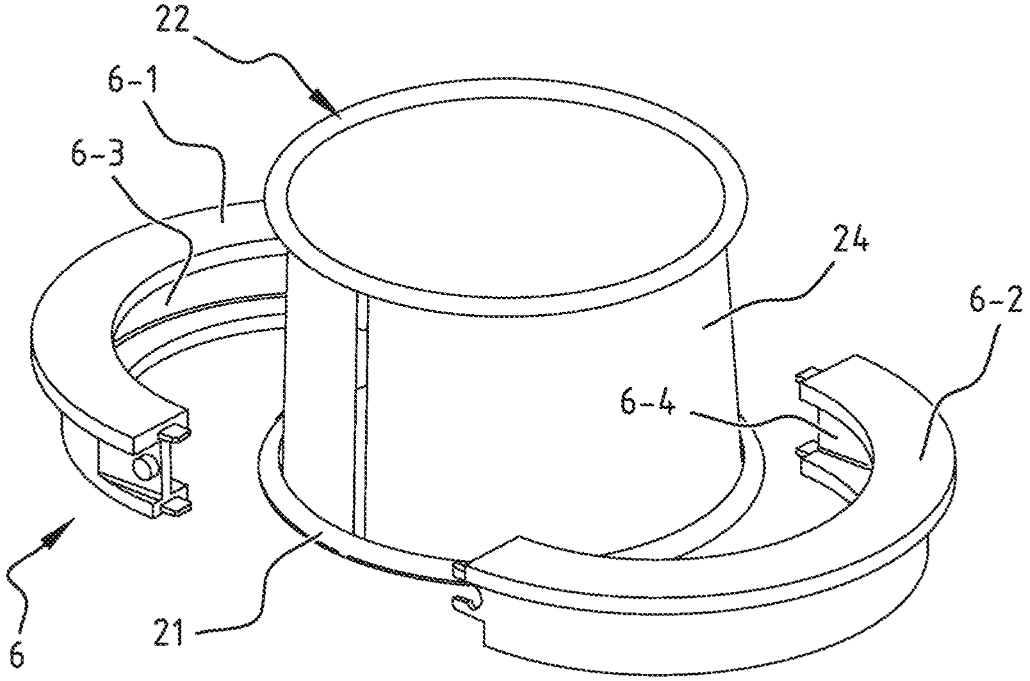
FIG. 16 represents a schematic view of a sealing element according to yet another embodiment of the invention in an open state.

With reference to FIG. 16 a schematic view of a sealing element according to yet another embodiment of the invention is shown in an open state. This embodiment uses a one-part sleeve 24 extending between a first member 21 in the form of a lower stiffened rim, and a second member in the form of an upper stiffened rim of the sleeve 24. The two members (21, 22) may be assembled in the sealed state by an assembling member 6, that comprises two dividable and re-unitable parts (6-1, 6-2).

Figure 18:
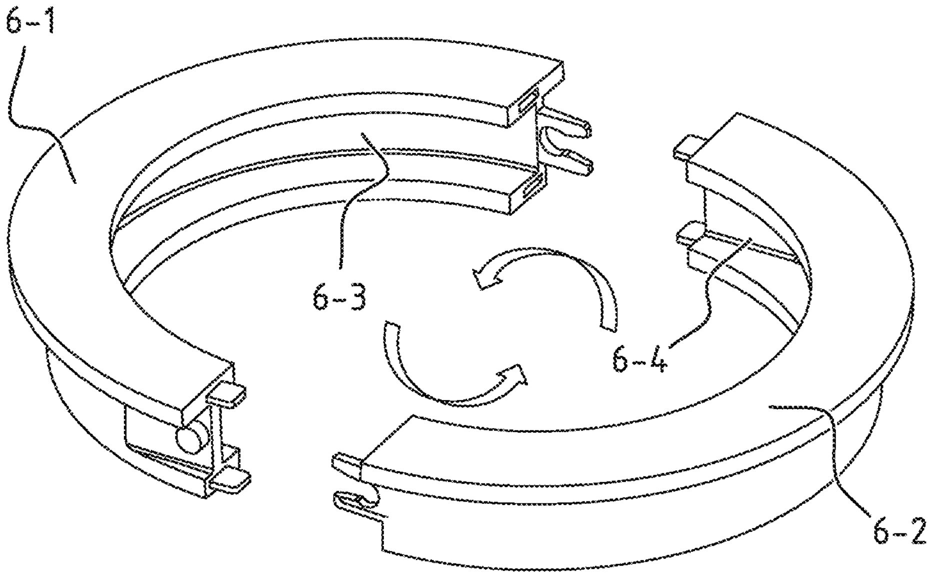
FIG. 18 represents a schematic view of the first and second member combined of the sealing element of FIG. 16.

The sleeve 24 is first twisted around an axial direction to seal it against a cable assembly (not shown in FIG. 16) provided within the sleeve 23 and the first member 21 and the second member 22 are then inserted in the C-shaped inner cavities (6-3, 6-4) of the assembling member parts (6-1, 6-2), which are then re-united to form a closed assembling member 6. The member parts (6-1, 6-2) may for instance be re-united or interlocked by a pin-hole connection, as shown in FIGS. 16 and 18. The stiffened rims may optionally be adhesively bonded to the cavities (6-1, 6-2).

Figure 17:
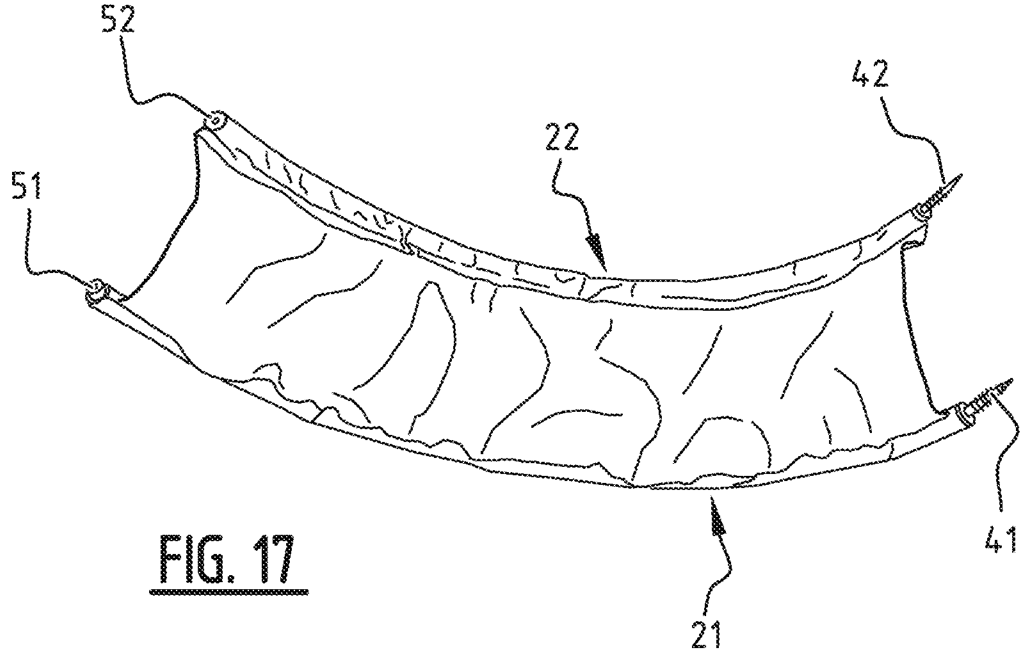
FIG. 17 represents a schematic view of the sleeve in divided state of the sealing element of FIG. 16.

As shown in FIG. 17, the stiffened rims (in this embodiment corresponding to the first member 21 and the second member 22) are dividable and may be re-united by inserting extensions (41, 42) into corresponding holes (51, 52) at an opposite side of the rims to form a closed loop.

Figure 14:
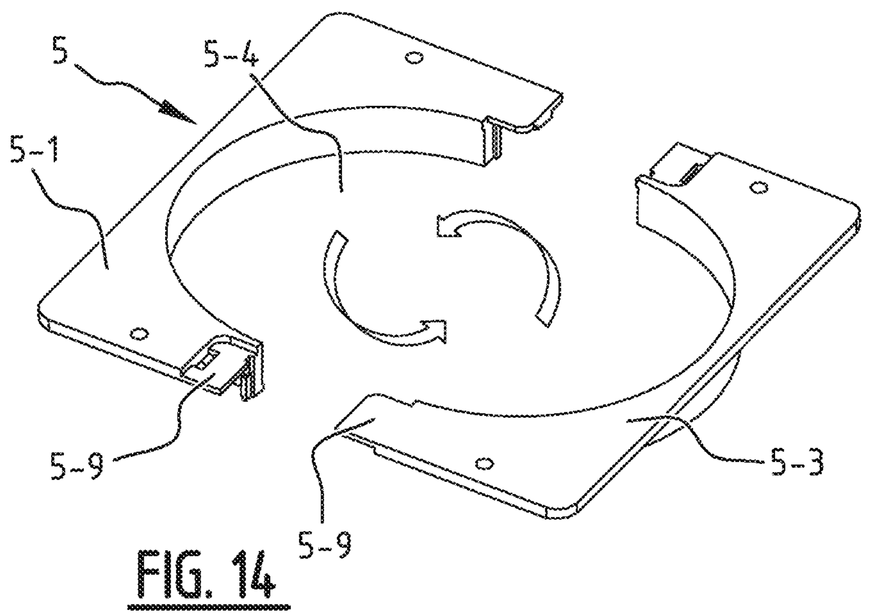
FIG. 14 represents a schematic perspective view of the base member used in FIG. 13.
Figure 19A:
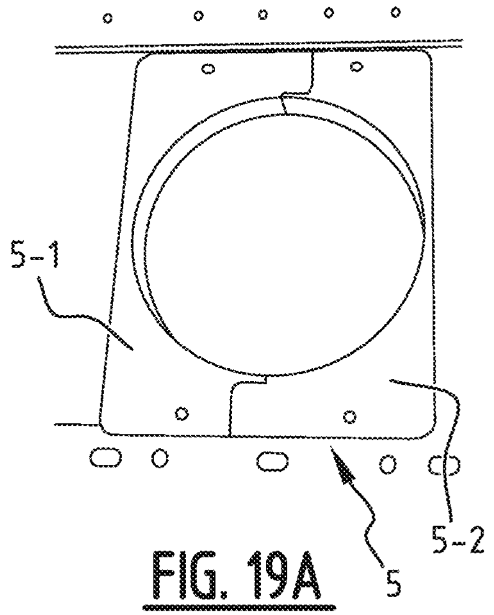
FIG. 19A represents a schematic view from above of a base member according to FIGS. 13 and 14 applied onto a floor wall of a cabinet; and finally
Figure 19B:
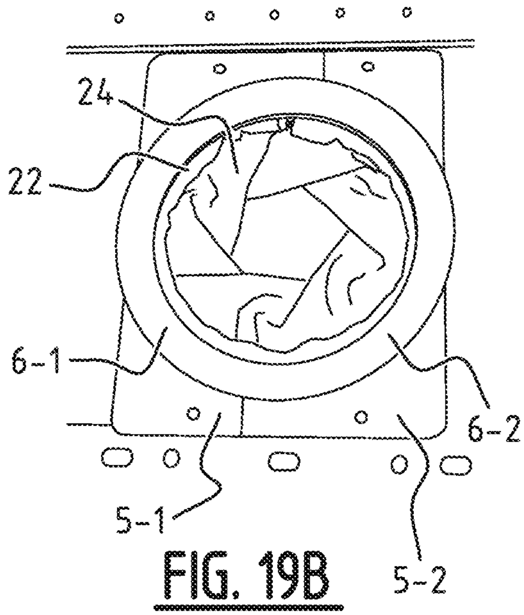
FIG. 19B represents a schematic view from above of a sealing element using the base member according to FIGS. 13 and 14 applied onto a floor wall of a cabinet.

In the assembled state, the sealing element 2 according to this embodiment may be fastened to a base member 5, such as the one shown in FIGS. 13 and 14. FIG. 19A shows this base member provided in a floor of a cabinet, while FIG. 19B represents a schematic view from above of the sealing element 2 fastened to the base member 5 applied onto the floor wall of the cabinet.

It will be apparent that many variations of the above-described embodiments may be envisaged by one skilled in the art within the scope of the invention as determined by the attached claims.

The invention claimed is:

1. Sealing element for sealing a passage for a cable assembly through a wall, the sealing element comprising a first member and a second member mutually coupled by a sleeve made of flexible material, wherein:

the first and the second member, as well as the sleeve, each have a peripheral wall that is dividable to accept a longitudinal part of the cable assembly inside the periphery of the first and the second member, as well as the sleeve, and re-unitable to enclose said longitudinal part;

the peripheral walls of the first and the second member are adapted to be engaged with each other in a sealed state; and the sealing element may be switched between an open state, wherein the first member and the second member are disengaged and held at an axial distance from each other in an axial direction; and the sealed state which may be provided by twisting the first and/or second member in the open state relative to each other around the axial direction causing the first and the second member to move towards each other and the sleeve to also twist and seal against the cable assembly provided through the passage, and by engaging the first and the second member with each other.

2. Sealing element as claimed in claim 1, wherein the peripheral wall of the first and/or the second member is adapted to be accommodated in the passage of the wall or provided against the wall and fastened thereto.

3. Sealing element as claimed in claim 1, further comprising a separate base member adapted to be accommodated in the passage of the wall and/or provided onto the wall and fastened thereto.

4. Sealing element as claimed in claim 3, wherein the peripheral wall of the first and/or the second member is adapted to be fastened to the base member.

5. Sealing element as claimed in claim 1, wherein the sleeve is tubular and adopts a flattened hyperboloid configuration in the sealed state.

6. Sealing element as claimed in claim 1, wherein the sleeve comprises at least one slitted sleeve part, preferably slitted in a longitudinal direction of the sleeve.

7. Sealing element as claimed in claim 1, wherein the peripheral wall of the first and the second members comprises a plurality of interlockable parts that may be disengaged to divide the peripheral wall.

8. Sealing element as claimed in claim 1, wherein the peripheral wall of the first and the second member comprises at least two hingedly connected parts that may be rotated around the hinge to divide the peripheral wall.

9. Sealing element as claimed in claim 1, wherein the peripheral walls of the first member and the second member are adapted to be engaged with each other in the sealed state by a click connection.

10. Sealing element as claimed in claim 1, wherein the flexible material in the sealed state is elastically loaded to an average strain of at least 2%.

11. Sealing element as claimed in claim 1, wherein the flexible material of the sleeve comprises a textile material, such as cloth, optionally coated with a membrane, and/or an elastomer.

12. Sealing element as claimed in claim 1, wherein an extended length of the sleeve between the first member and the second member in the open state ranges from 0.5 to 2.0 times a transverse dimension of the first and/or second member.

13. Sealing element as claimed in claim 1, wherein an extended length of the sleeve between the first member and the second member in the open state ranges from 30 to 200 mm.

14. Sealing element as claimed in claim 1, wherein an extended length of the sleeve between the first member and the second member in the open state is such that the sealed state may be reached by twisting the second member relative to the first member around the axial direction over an angle of 180 degrees.

15. Sealing element as claimed in claim 1, wherein an extended length of the sleeve between the first member and the second member in the open state is such that the sealed state is substantially airtight.

16. Sealing element as claimed in claim 1, wherein the peripheral wall of at least one of the first and second members comprises a plurality of interlockable parts, preferably two interlockable parts, more preferably interlockable pinhole connections.

17. A wall comprising a passage for a cable assembly, which passage comprises a sealing element as claimed in claim 1.

18. Wall as claimed in claim 17, comprising sheet metal with a wall thickness not exceeding 2.1 mm.

19. Housing for accommodating devices such as electrical, electronic and optical devices, comprising a sealing element as claimed in claim 1.

20. Method for at least partly sealing a passage for a cable assembly through a wall, comprising:

providing a sealing element as claimed in claim 1;

providing a cable assembly through the passage and the divided sealing element and re-uniting said sealing element to enclose the cable assembly;

bringing the sealing element from the open state, in which the first and the second member are disengaged and held at an axial distance from each other in an axial direction to the sealed state by twisting the first and/or the second member in the open state relative to each other around the axial direction causing the first and the second member to move towards each other and the sleeve to seal against the cable assembly provided through the passage, and engaging the first and the second member with each other.

21. Method as claimed in claim 20, wherein the sealing element is accommodated in the passage of the wall or provided onto the wall and fastened thereto.

22. Method as claimed in claim 20, further comprising the steps of accommodating a separate base member in the passage of the wall and/or provide it onto the wall and fasten it thereto.

23. Method as claimed in claim 22, wherein the peripheral wall of the first and/or the second member is fastened to the base member.

24. Method for unsealing a sealed passage for a cable assembly through a wall using a sealing element as claimed in claim 1, comprising:

disengaging the first and the second member from each other;

bringing the sealing element from the sealed state to the open state by untwisting the first and the second member in the closed state relative to each other around the axial direction causing the first and the second member to move away from each other and the sleeve to unseal from the cable assembly provided through the passage.

25. Method as claimed in claim 24, further comprising the step of removing the cable assembly from the passage.

26. Method as claimed in claim 24, further comprising the step of adding, removing and/or replacing a second cable assembly through the passage and the sealing element.

* * * * *